(12) United States Patent
Sugimoto

(10) Patent No.: US 12,126,304 B2
(45) Date of Patent: Oct. 22, 2024

(54) AMPLIFIER CIRCUIT AND AMPLIFIER DEVICE

(71) Applicant: Murata Manufacturing Co., Ltd., Kyoto (JP)

(72) Inventor: Yasutaka Sugimoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 493 days.

(21) Appl. No.: 17/481,598

(22) Filed: Sep. 22, 2021

(65) Prior Publication Data

US 2022/0006427 A1 Jan. 6, 2022

Related U.S. Application Data

(63) Continuation of application No. PCT/JP2020/015279, filed on Apr. 3, 2020.

(30) Foreign Application Priority Data

Apr. 4, 2019 (JP) .................................. 2019-072330

(51) Int. Cl.
*H03F 1/02* (2006.01)
*H03F 3/19* (2006.01)
*H03F 3/21* (2006.01)

(52) U.S. Cl.
CPC ............ *H03F 1/0211* (2013.01); *H03F 3/19* (2013.01); *H03F 3/21* (2013.01);
(Continued)

(58) Field of Classification Search
CPC . H03F 1/0211; H03F 3/19; H03F 3/21; H03F 2200/381; H03F 2200/451;
(Continued)

(56) References Cited

U.S. PATENT DOCUMENTS 5,675,290 A 10/1997 Tsukahara et al.
6,333,677 B1 * 12/2001 Dening .................. H03F 1/302
330/296

(Continued)

FOREIGN PATENT DOCUMENTS

CN 1612465 A 5/2005
JP H09-51238 A 2/1997
(Continued)

OTHER PUBLICATIONS

International Search Report for International Patent Application No. PCT/JP2020/015279 dated Jun. 23, 2020.
(Continued)

*Primary Examiner* — Hieu P Nguyen
(74) *Attorney, Agent, or Firm* — Pearne & Gordon LLP

(57) ABSTRACT

An amplifier circuit includes an input terminal to which a radio frequency signal is input, an amplifier transistor that has a control terminal and amplifies the radio frequency signal, a bias circuit that includes an emitter-follower circuit or a source-follower circuit and supplies a bias current to the control terminal of the amplifier transistor, an inductor arranged in series between an emitter of the emitter-follower circuit and the control terminal of the amplifier transistor or between a source of the source-follower circuit and the control terminal of the amplifier transistor, and a variable resistance circuit connected to the inductor.

14 Claims, 9 Drawing Sheets

(52) U.S. Cl.
CPC .. *H03F 2200/381* (2013.01); *H03F 2200/451* (2013.01); *H03F 2200/465* (2013.01); *H03F 2200/468* (2013.01); *H03F 2200/471* (2013.01)

(58) Field of Classification Search
CPC ......... H03F 2200/465; H03F 2200/468; H03F 2200/471; H03F 1/0261; H03F 3/211; H03F 3/245
USPC ................................................ 330/285, 296
See application file for complete search history.

(56) References Cited

U.S. PATENT DOCUMENTS

| | | |
|---|---|---|
| 10,320,336 B2 * | 6/2019 | Rogers .................. H03F 1/3241 |
| 11,342,889 B2 * | 5/2022 | Maxim .................... H03F 1/302 |
| 2005/0077964 A1 | 4/2005 | Maeda |

FOREIGN PATENT DOCUMENTS

| | | |
|---|---|---|
| JP | H10-290129 A | 10/1998 |
| JP | 2005-006212 A | 1/2005 |
| JP | 2005-143079 A | 6/2005 |
| JP | 2008-047978 A | 2/2008 |
| JP | 2009-017494 A | 1/2009 |
| JP | 2012-065105 A | 3/2012 |

OTHER PUBLICATIONS

Written Opinion for International Patent Application No. PCT/JP2020/015279 dated Jun. 23, 2020.

\* cited by examiner

AMPLIFIER CIRCUIT AND AMPLIFIER DEVICE

CROSS REFERENCE TO RELATED APPLICATIONS

This is a continuation of International Application No. PCT/JP2020/015279 filed on Apr. 3, 2020 which claims priority from Japanese Patent Application No. 2019-072330 filed on Apr. 4, 2019. The contents of these applications are incorporated herein by reference in their entireties.

BACKGROUND

Technical Field

The present disclosure relates to amplifier circuits and amplifier devices.

In general, an amplifier circuit that amplifies a radio frequency signal is known. For example, Patent Document 1 discloses an amplifier circuit that includes an amplifying transistor and a bias circuit that supplies a bias current to the base of the amplifying transistor.

In the amplifier circuit described in Patent Document 1, a biasing inductor is provided between the bias circuit and the base. The biasing inductor functions as a low pass filter that suppresses a backward flow of a radio frequency signal to the bias circuit.

Patent Document 1: Japanese Unexamined Patent Application Publication No. 2009-17494

BRIEF SUMMARY

In the amplifier circuit of the related art described above, the inductance value of the biasing inductor is fixed at one value. Because of this, it is difficult to adjust the bias current supplied via the biasing inductor to an appropriate magnitude according to a mass-production variation of the amplifying transistors or a change in characteristics of the amplifying transistor caused by a surrounding environment or the like, and this causes a problem of degradation in linearity of the amplifying transistor.

The present disclosure provides an amplifier circuit and an amplifier device, each of which has a more appropriate linearity than the related art.

An amplifier circuit according to one aspect of the present disclosure includes: an input terminal to which a radio frequency signal is input; an amplifier transistor that has a control terminal and amplifies the radio frequency signal; a bias circuit that includes an emitter-follower circuit or a source-follower circuit and supplies a bias current to the control terminal; an inductor arranged in series between an emitter of the emitter-follower circuit and the control terminal or between a source of the source-follower circuit and the control terminal; and a variable resistance circuit connected to the inductor.

Further, an amplifier device according to one aspect of the present disclosure includes the amplifier circuit and a control unit that controls the variable resistance circuit.

The present disclosure can provide an amplifier circuit and an amplifier device, each of which has a more appropriate linearity than the related art.

DETAILED DESCRIPTION

Figure 1:
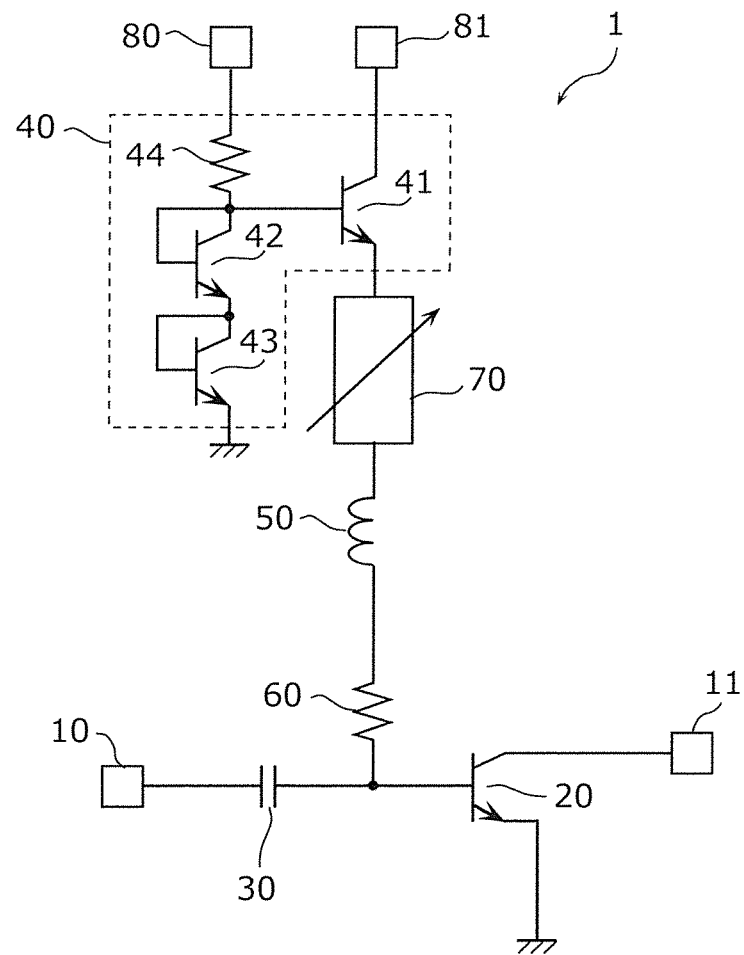
FIG. 1 is a circuit diagram of an amplifier circuit according to an embodiment 1.

Hereinafter, amplifier circuits and amplifier devices according to embodiments of the present disclosure will be described in detail with reference to the drawings. Note that embodiments which will be described below each illustrate a specific example of the present disclosure. Therefore, numeric values, shapes, materials, constituent elements, arrangements and connection modes of the constituent elements, steps, sequences of the steps, and the like are mere examples and not intended to limit the present disclosure. Therefore, of constituent elements in the following embodiments, constituent elements that are not described in an independent claim will be described as optional constituent elements.

Further, each drawing is a schematic drawing and is not exact illustration. Therefore, for example, scales in different drawings do not necessarily coincide with each other. Further, in the drawings, the same reference code is given to substantially the same constituent element, and an overlapping description thereof is omitted or simplified.

Further, in the present specification, that "A" and "B", which are each an element, a terminal, or the like, are connected not only means that "A" and "B" are directly connected to each other without necessarily another element, another terminal, or the like interposed therebetween but also means that "A" and "B" are electrically connected to each other with another element, another terminal, or the like interposed therebetween.

Embodiment 1

1. Configuration

First, a configuration of an amplifier circuit according to the embodiment 1 is described with reference to FIG. 1. FIG. 1 is a circuit diagram of an amplifier circuit 1 according to the present embodiment.

The amplifier circuit 1 according to the present embodiment amplifies a radio frequency signal. The radio frequency signal is a signal that conforms to a communication standard, such as Wi-Fi (registered trademark), LTE (Long Term Evolution), 5G (5th Generation), or the like. The amplifier circuit 1 is, for example, an amplifier circuit that is connected to an antenna element and amplifies a radio frequency signal to be transmitted from the antenna element. The amplifier circuit 1 is, for example, a power amplifier that amplifies a transmitting radio frequency signal. The amplifier circuit 1 is, for example, arranged in a front-end unit of a multimode/multiband mobile phone. The amplifier circuit 1 is, for example, formed in an IC (Integrated Circuit) element.

As illustrated in FIG. 1, the amplifier circuit 1 includes an input terminal 10, an output terminal 11, an amplifier transistor 20, a DC-cut capacitor 30, a bias circuit 40, an inductor 50, a ballast resistor 60, a variable resistance circuit 70, and power supply terminals 80 and 81.

The input terminal 10 is a terminal to which a radio frequency signal is input. For example, a RFIC or the like is connected to the input terminal 10.

The output terminal 11 is a terminal from which a radio frequency signal that has been amplified by the amplifier transistor 20 is output. For example, an antenna element is connected to the output terminal 11 with a switch circuit (not illustrated) or the like interposed therebetween.

The amplifier transistor 20 has a control terminal and amplifies a radio frequency signal input to the input terminal 10. In the present embodiment, the amplifier transistor 20 is a bipolar transistor and has a base, a collector, and an emitter. The amplifier transistor 20 is, for example, an npn-type bipolar transistor that is formed using silicon (Si) or silicon-germanium (SiGe).

The base of the amplifier transistor 20 is an example of the control terminal and is connected to the input terminal 10 with the DC-cut capacitor 30 interposed therebetween. The collector of the amplifier transistor 20 is connected to the output terminal 11. The emitter of the amplifier transistor 20 is connected to ground (that is to say, earthed).

The DC-cut capacitor 30 removes a DC component included in a radio frequency signal input to the input terminal 10. The DC-cut capacitor 30 is arranged in series in a path connecting the input terminal 10 and the base of the amplifier transistor 20. Specifically, one end portion of the DC-cut capacitor 30 is connected to the input terminal 10, and the other end portion of the DC-cut capacitor 30 is connected to the base of the amplifier transistor 20.

The bias circuit 40 is a circuit that supplies a bias current to the control terminal of the amplifier transistor 20. The bias circuit 40 includes an emitter-follower circuit. Specifically, as illustrated in FIG. 1, the bias circuit 40 includes transistors 41, 42, and 43 and a resistor 44.

The transistors 41, 42, and 43 are each a bipolar transistor and each have a base, a collector, and an emitter. Each of the transistors 41, 42, and 43 is, for example, an npn-type bipolar transistor that is formed using silicon (Si) or silicon-germanium (SiGe).

The transistor 41 is a transistor that forms an emitter-follower circuit. The base of the transistor 41 is connected to the base and the collector of the transistor 42 and one end portion of the resistor 44. The collector of the transistor 41 is connected to the power supply terminal 81. The emitter of the transistor 41 is connected to the inductor 50 with the variable resistance circuit 70 interposed therebetween. Alternatively, the emitter of the transistor 41 may be directly connected to the inductor 50.

The transistors 42 and 43 are provided to stabilize a base current flowing into the transistor 41. The base and the collector of the transistor 42 are connected to each other and are connected to the one end portion of the resistor 44 and the base of the transistor 41. The base and the collector of the transistor 43 are connected to each other and are connected to the emitter of the transistor 42. The emitter of the transistor 43 is connected to ground.

The resistor 44 is arranged in series between the base of the transistor 41 and the power supply terminal 80. Specifically, the one end portion of the resistor 44 is connected to the base of the transistor 41 and the base and the collector of the transistor 42. The other end portion of the resistor 44 is connected to the power supply terminal 80.

The bias circuit 40 configured as described above supplies a collector current flowing through the transistor 41 to the base of the amplifier transistor 20 as the bias current. In the present embodiment, the inductor 50, the ballast resistor 60, and the variable resistance circuit 70 are connected in series between the emitter of the transistor 41 and the base of the amplifier transistor 20. Because of these, the magnitude of the collector current of the transistor 41 is adjusted, and the bias current of an appropriate magnitude is supplied to the base of the amplifier transistor 20.

The inductor 50 is arranged in series between the emitter of the emitter-follower circuit included in the bias circuit 40 and the control terminal of the amplifier transistor 20. Specifically, one end portion of the inductor 50 is connected to the emitter of the transistor 41 with the variable resistance circuit 70 interposed therebetween. The other end portion of the inductor 50 is connected to the ballast resistor 60.

The inductor 50 is a choke inductor and functions as a low pass filter that hinders a radio frequency signal input to the input terminal 10 from flowing into the bias circuit 40. However, the inductor 50 does not completely shut off a radio frequency signal. Part of the radio frequency signal is coupled with the transistor 41 of the bias circuit 40 via the inductor 50.

The inductor 50 is, for example, formed from a conductor pattern formed in an IC element. For example, the inductor 50 is a spiral inductor formed using an electrically conductive material such as a metal or the like.

The ballast resistor 60 is arranged in series between the inductor 50 and the control terminal of the amplifier transistor 20. Specifically, one end portion of the ballast resistor 60 is connected to the inductor 50. The other end portion of the ballast resistor 60 is connected to a path connecting the DC-cut capacitor 30 and the base of the amplifier transistor 20. That is to say, the other end portion of the ballast resistor 60 is directly electrically connected the base of the amplifier transistor 20.

The variable resistance circuit 70 is connected to the inductor 50. In the present embodiment, the variable resistance circuit 70 is an example of a first variable resistance circuit connected in series to the inductor 50. Specifically, one end portion of the variable resistance circuit 70 is connected to the emitter of the transistor 41 that forms the emitter-follower circuit of the bias circuit 40. The other end portion of the variable resistance circuit 70 is connected to the one end portion of the inductor 50.

Alternatively, the variable resistance circuit 70 may be arranged between the inductor 50 and the base of the amplifier transistor 20. Specifically, the one end portion of the variable resistance circuit 70 may be connected to the other end portion (terminal on the side of the amplifier transistor 20) of the inductor 50, and the other end portion of the variable resistance circuit 70 may be connected to the base of the amplifier transistor 20 or the ballast resistor 60.

The power supply terminal 80 is a power supply terminal for controlling the emitter-follower of the bias circuit 40. The power supply terminal 81 is a power supply terminal for supplying the bias current. Each of the power supply terminals 80 and 81 is connected to a voltage source that supplies a predetermined voltage.

2. Functions of Ballasr Resistor, Inductor, and Variable Resistance Circuit

Typically, the amplifier transistor 20, which is used as a power amplifier for amplifying a radio frequency signal, is biased as a class AB amplifier for the purpose of achieving higher efficiency. Further, in order to suppress thermal runaway of the amplifier transistor 20, the ballast resistor 60 is provided between the base of the amplifier transistor 20 and the bias circuit 40.

When the temperature of the amplifier transistor 20 increases, a threshold value of the amplifier transistor 20 decreases, and a large collector current is likely to flow. This causes the thermal runaway. In an amplifier device including a multicell amplifier transistor 20, this phenomenon is particularly problematic because this phenomenon causes the thermal deviation between cells to increase. Note that a specific example of the amplifier device including a multicell amplifier transistor 20 will be described below in an embodiment 2 and the like.

The ballast resistor 60 is used as a countermeasure against thermal runaway. Specifically, when a large bias current flows through the ballast resistor 60, a voltage drops at the ballast resistor 60, and this makes it possible to reduce the base potential of the amplifier transistor 20. Because of this, it becomes possible to suppress thermal runaway of the amplifier transistor 20, which occurs when the collector current increases in association with a temperature increase.

On the other hand, typically, the collector current of the amplifier transistor 20, which is biased as a class AB amplifier, increases as RF output power increases. Because of this, the DC power injected into the amplifier transistor 20 increases as the RF output power increases, and this makes it possible to operate with a constant gain up to a high RF output power. However, the ballast resistor 60 suppresses an increase in the collector current as described above. Therefore, because of the ballast resistor 60, the gain of the amplifier transistor 20 decreases as the RF output power increases. In order to have a favorable EVM (Error Vector Modulation) characteristic in the case where the amplifier circuit 1 is used in a transmitter circuit, it is desirable to keep the gain of the amplifier transistor 20 constant when the RF output power changes. That is to say, it is desirable to have the bias circuit 40 having capability of increasing the collector current in response to a change in the RF output power while having the ballast resistor 60 suitable for suppressing thermal runaway.

In the present embodiment, the inductor 50 is connected between the path connecting the input terminal 10 and the base of the amplifier transistor 20 and the emitter of the emitter-follower circuit (specifically, the transistor 41) included in the bias circuit 40. Because of this, part of a radio frequency signal supplied from the input terminal 10 to the base of the amplifier transistor 20 couples with the bias circuit 40 via the inductor 50. By coupling part of a radio frequency signal with the bias circuit 40, it becomes possible to supply a bias current having an appropriate magnitude to the amplifier transistor 20. This makes it possible to facilitate the maintaining of a constant gain of the amplifier transistor 20 when the output power changes.

In the case where the inductance value of the inductor 50 is small, the coupling between the radio frequency signal and the bias circuit 40 is large. In the case where the inductance value of the inductor 50 is large, the coupling between the radio frequency signal and the bias circuit 40 is small. That is to say, it becomes possible to adjust the amount of coupling by adjusting the inductance value of the inductor 50. By adjusting the amount of coupling according to the characteristics of the amplifier transistor 20, it becomes possible to facilitate the maintaining of a constant gain when the output power changes.

However, it is not easy to make the inductance value of the inductor 50 variable. In order to change the inductance value, it is necessary to change the pattern of the inductor 50, and this decreases design efficiency.

In contrast, in the amplifier circuit 1 according to the present embodiment, the variable resistance circuit 70 is connected to the inductor 50. The inductance value of the inductor 50 is a fixed value. By changing the resistance value of the variable resistance circuit 70, it becomes possible to change the impedance between the line connecting the input terminal 10 and the base of the amplifier transistor 20 and the emitter of the transistor 41 of the bias circuit 40. Changing the impedance enables the adjustment of the amount of coupling between the radio frequency signal and the bias circuit 40.

Therefore, in the amplifier circuit 1 according to the present embodiment, it becomes possible to facilitate the maintaining of a constant gain when the output power changes. This enables the realization of the amplifier circuit 1 having a more appropriate linearity than the related art. The variable resistance circuit 70 included in the amplifier circuit 1 functions as a distortion-reducing resistor that reduces the distortion of a radio frequency signal on the side of the output terminal 11.

Alternatively, in the case where the amplifier transistor 20 has higher heat dissipating ability, the ballast resistor 60 may not need to be provided.

3. Specific Example of Variable Resistance Circuit

Hereinafter, a specific configuration of the variable resistance circuit 70 is described using FIG. 2 to FIG. 5.

3-1. First Example

Figure 2:
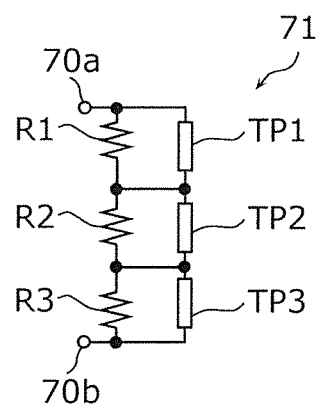
FIG. 2 is a circuit diagram of a first example of a variable resistance circuit of the amplifier circuit according to the embodiment 1.

FIG. 2 is a circuit diagram of a first example of the variable resistance circuit 70 of the amplifier circuit 1 according to the present embodiment. A variable resistance circuit 71 illustrated in FIG. 2 is a specific example of the variable resistance circuit 70 illustrated in FIG. 1. The variable resistance circuit 71 is, for example, used as the variable resistance circuit 70 by a terminal 70a being connected to the emitter of the transistor 41 and a terminal 70b being connected to the one end portion of the ballast resistor 60.

As illustrated in FIG. 2, the variable resistance circuit 71 includes three resistors R1, R2, and R3 and three trimming patterns TP1, TP2, and TP3. Alternatively, each of the number of the resistors and the number of the trimming patterns included in the variable resistance circuit 71 may be one or may be two, four, or more. The number of the resistors and the number of the trimming patterns are the same, but these numbers may be different from each other.

These three resistors R1, R2, and R3 are connected in series. The resistance values of these three resistors R1, R2, and R3 are equal to each other. Alternatively, at least one of the three resistors R1, R2, and R3 may have a resistance value different from the resistance value of the other resistors. All of the resistors included in the variable resistance circuit 71 may have resistance values different from each other.

The three trimming patterns TP1, TP2, and TP3 are provided correspondingly to the three resistors R1, R2, and R3, respectively. Specifically, the trimming pattern TP1 is connected in parallel to the resistor R1. The trimming pattern TP2 is connected in parallel to the resistor R2. The trimming pattern TP3 is connected in parallel to the resistor R3. Further, the trimming patterns TP1, TP2, and TP3 are connected in series.

The trimming patterns TP1, TP2, and TP3 are formed, for example, using an electrically conductive material such as a metal or the like. The trimming patterns TP1, TP2, and TP3 are each, for example, part of a metal wire line and have electrical resistances that are sufficiently smaller than the electrical resistances of the resistors R1, R2, and R3. Because of this, the resistance value between the terminals 70a and 70b of the variable resistance circuit 71 can be regarded as substantially equal to 0.

Note that the resistance value between the terminals 70a and 70b of the variable resistance circuit 71 is simply referred to as the resistance value of the variable resistance circuit 71. The same applies to variable resistance circuits 72, 73, and 74 which will be described below.

Each of the trimming patterns TP1, TP2, and TP3 can be easily cut by laser irradiation (laser trimming). A path of a current flowing through a trimming pattern is cut off by cutting the trimming pattern. It becomes possible to adjust the resistance value of the variable resistance circuit 71 by cutting at least one of the trimming patterns TP1, TP2, and TP3. For example, in the case where the trimming pattern TP1 is cut, the resistance value of the variable resistance circuit 71 becomes substantially equal to the resistance value of the resistor R1. In the case where the trimming pattern TP2 is cut, the resistance value of the variable resistance circuit 71 becomes substantially equal to the resistance value of the resistor R2. Further, in the case where the trimming patterns TP1 and TP3 are cut, the resistance value of the variable resistance circuit 71 becomes substantially equal to the total value of the resistance values of the resistors R1 and R3.

As described above, the laser trimming makes it possible to adjust the resistance value of the variable resistance circuit 71. For example, by measuring characteristics of the amplifier transistor 20 after fabricating the amplifier circuit 1, it becomes possible to adjust the resistance value according to a measurement result. For example, by measuring the gain of the amplifier transistor 20, it becomes possible to adjust the resistance value according to a measurement result of the gain. Further, for example, by monitoring characteristics of a wafer from which the amplifier transistor 20 is formed at a middle of a wafer processing step, which is one of fabrication processing steps of the amplifier circuit 1, it becomes possible to change the resistance value by changing, based on a monitoring result, a wiring path in the variable resistance circuit 71. As described above, it becomes possible to adjust the resistance value of the variable resistance circuit 71 to an appropriate value according to a mass-production variation in characteristics of the amplifier transistor 20.

3-2. Second Example

Figure 3:
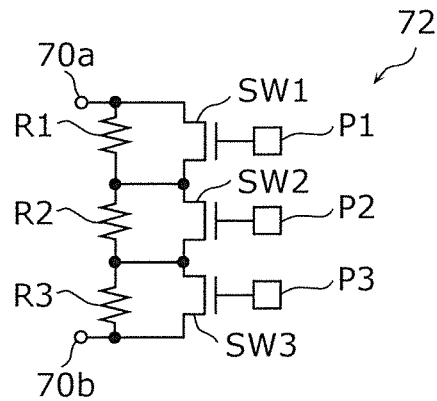
FIG. 3 is a circuit diagram of a second example of the variable resistance circuit of the amplifier circuit according to the embodiment 1.

FIG. 3 is a circuit diagram of a second example of the variable resistance circuit 70 of the amplifier circuit 1 according to the present embodiment. Hereinafter, the second example is described with the emphasis on the difference from the variable resistance circuit 71 according to the first example, and the description regarding the common part is omitted or simplified.

As illustrated in FIG. 3, a variable resistance circuit 72 includes three resistors R1, R2, and R3, three switches SW1, SW2, and SW3, and three control terminals P1, P2, and P3. Alternatively, each of the number of the resistors, the number of the switches, and the number of the control terminals included in the variable resistance circuit 72 may be one or may be two, four, or more. The number of the resistors and the number of the switches are the same, but these numbers may be different from each other.

As is the case with the variable resistance circuit 71 according to the first example, these three resistors R1, R2, and R3 are connected in series.

The three switches SW1, SW2, and SW3 are provided correspondingly to the three resistors R1, R2, and R3, respectively. Specifically, the switch SW1 is connected in parallel to the resistor R1. The switch SW2 is connected in parallel to the resistor R2. The switch SW3 is connected in parallel to the resistor R3. Further, the switch SW1, SW2, and SW3 are connected in series.

The switches SW1, SW2, and SW3 are each a switching element such as, for example, MOSFET (Metal Oxide Semiconductor Field Effect Transistor) or the like. The MOSFET is an n-type MOSFET but may alternatively be a p-type MOSFET. Further, an n-type MOSFET and a p-type MOSFET may be included in a mixed manner.

The switches SW1, SW2, and SW3 switch between being conductive (ON) and non-conductive (OFF) in response to control signals supplied to the control terminals P1, P2, and P3, respectively. The control terminal P1 is connected to a gate of the switch SW1. The control terminal P2 is connected to a gate of the switch SW2. The control terminal P3 is connected to a gate of the switch SW3. By supplying a control signal independently to each of the control terminals P1, P2, and P3, each of the switches SW1, SW2, and SW3 makes it possible to switch between being conductive and non-conductive independently from each other.

By switching each of the switches SW1, SW2, and SW3 between being conductive and non-conductive, it becomes possible to adjust the resistance value of the variable resistance circuit 72. A specific example of change in the resistance value is substantially the same as that of the variable resistance circuit 71 according to the first example.

Note that in the variable resistance circuit 71, once the trimming pattern is cut, it is difficult to make the trimming pattern conductive again. In contrast, in the variable resistance circuit 72, it becomes possible to repeat the switching between being conductive and non-conductive. Therefore, it becomes possible to dynamically adjust the resistance value of the variable resistance circuit 72 according to a temperature increase of the amplifier transistor 20 or a change in another characteristic.

3-3. Third Example

Figure 4:
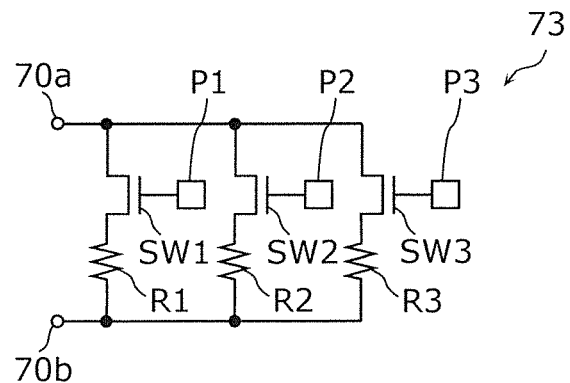
FIG. 4 is a circuit diagram of a third example of the variable resistance circuit of the amplifier circuit according to the embodiment 1.

FIG. 4 is a circuit diagram of a third example of the variable resistance circuit 70 of the amplifier circuit 1 according to the present embodiment. Hereinafter, the third example is described with the emphasis on the difference from the variable resistance circuit 72 according to the second example, and the description regarding the common part is omitted or simplified.

As illustrated in FIG. 4, a variable resistance circuit 73 includes three resistors R1, R2, and R3, three switches SW1, SW2, and SW3, and three control terminals P1, P2, and P3. The variable resistance circuit 73 is different from the variable resistance circuit 72 according to the second example in the element connection relation.

Specifically, the resistor R1 and the switch SW1 are connected in series to each other. The resistor R2 and the switch SW2 are connected in series to each other. The resistor R3 and the switch SW3 are connected in series to each other. Further, a series circuit of the resistor R1 and the switch SW1, a series circuit of the resistor R2 and the switch SW2, and a series circuit of the resistor R3 and the switch SW3 are connected in parallel to each other. The number of the series circuits connected in parallel may be two, four, or more.

According to the configuration described above, as is the case with the variable resistance circuit 72 according to the second example, it becomes possible to adjust the resistance value of the variable resistance circuit 73 by switching each of the switches SW1, SW2, and SW3 between being conductive and non-conductive. Further, the variable resistance circuit 73 makes it possible to repeat the switching between being conductive and non-conductive. Therefore, it becomes possible to dynamically adjust the resistance value of the variable resistance circuit 73 according to a temperature increase of the amplifier transistor 20.

Further, each of ON resistances of the switches SW1, SW2, and SW3 can be used as part of the resistance, and thus it becomes possible to use a MOSFET having a smaller size and a larger ON resistance. Because the downsizing of the switches SW1, SW2, and SW3 is achieved, it becomes possible to reduce the size of the variable resistance circuit 73. Further, in the second example, because each of the ON resistances of the switches SW1, SW2, and SW3 is inserted in series, it is difficult to achieve a low resistance. Whereas, in the third example, because each of the ON resistances of the switches SW1, SW2, and SW3 is inserted in parallel, it becomes possible to easily achieve a low resistance. On the other hand, in the second example, because each of OFF capacitances of the switches SW1, SW2, and SW3 is inserted in series, it is relatively easy to achieve a high resistance. Whereas, in the third example, because each of the OFF capacitances of the switches SW1, SW2, and SW3 is inserted in parallel, it is difficult to achieve a high resistance (a high impedance). Therefore, it become possible to achieve a variable resistance with a wider range by selectively using one of the variable resistance circuits of the second example and the third example or by combining the variable resistance circuits of the second example and the third example.

3-4. Fourth Example

Figure 5:
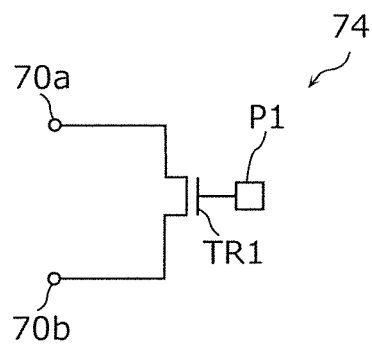
FIG. 5 is a circuit diagram of a fourth example of the variable resistance circuit of the amplifier circuit according to the embodiment 1.

FIG. 5 is a circuit diagram of a fourth example of the variable resistance circuit 70 of the amplifier circuit 1 according to the present embodiment. Hereinafter, the fourth example is described with the emphasis on the difference from the variable resistance circuit 73 according to the third example, and the description regarding the common part is omitted or simplified.

As illustrated in FIG. 5, a variable resistance circuit 74 includes a transistor TR1 and a control terminal P1. Alternatively, each of the number of the transistors and the number of the control terminals included in the variable resistance circuit 74 may be two or more. For example, a plurality of transistors TR1 may be connected in series or in parallel to each other.

The transistor TR1 is a MOSFET. In the case where the voltage applied to the control terminal P1 of the transistor TR1 changes, the resistance value of the transistor TR1 changes. Specifically, the ON resistance of the transistor TR1 changes according to the magnitude of a control signal given to the control terminal P1.

The variable resistance circuit 74 utilizes the ON resistance of the transistor TR1. That is to say, the variable resistance circuit 74 is a circuit that can change its own resistance value without necessarily using any resistor. Because there is no need to provide the resistors R1, R2, and R3, such as the ones included in the variable resistance circuit 73 according to the third example, it becomes possible to reduce the size of the variable resistance circuit 74.

4. Advantageous Effects and the Like

As described above, the amplifier circuit 1 according to the present embodiment includes the input terminal 10 to which a radio frequency signal is input, the amplifier transistor 20 that has the control terminal and amplifies a radio frequency signal, the bias circuit 40 that includes the emitter-follower circuit and supplies the bias current to the control terminal, the inductor 50 arranged in series between the emitter of the emitter-follower circuit and the control terminal, and the variable resistance circuit 70, 71, 72, 73, or 74 connected to the inductor 50.

Because of this, the variable resistance circuit 70, 71, 72, 73, or 74 is connected to the inductor 50. Thus, it becomes possible to adjust the amount of coupling between a radio frequency signal and the bias circuit 40 by adjusting the resistance value of the variable resistance circuit 70. By adjusting the amount of coupling to an appropriate value, a bias current having an appropriate magnitude is supplied to the base of the amplifier transistor 20. Therefore, it becomes possible to facilitate the maintaining of a constant gain when the output power changes. This enables the realization of the amplifier circuit 1 having a more appropriate linearity than the related art.

Further, for example, the variable resistance circuit 70, 71, 72, 73, or 74 is connected in series to the inductor 50.

This makes it possible to cause the variable resistance circuit 70, 71, 72, 73, or 74 to function as part of the ballast resistor. Because of this, it becomes possible to suppress the gain increase when the output power is high.

Further, for example, the amplifier circuit 1 further includes the ballast resistor 60 arranged in series between the inductor 50 and the control terminal of the amplifier transistor 20.

This makes it possible to suppress thermal runaway of the amplifier transistor 20.

Further, for example, the variable resistance circuit 72 includes the resistor R1 and the switch SW1 connected in parallel to the resistor R1.

This makes it possible to adjust the resistance value of the variable resistance circuit 72 by switching between ON and OFF of the switch SW1. For example, based on a detection result of the temperature of the amplifier transistor 20 or the like, the resistance value of the variable resistance circuit 72 can be adjusted dynamically during operation of the amplifier circuit 1. Thus, it becomes possible to supply a bias current having an appropriate magnitude to the amplifier transistor 20.

Further, for example, the variable resistance circuit 73 includes the resistor R1 and the switch SW1 connected in series to the resistor R1.

This makes it possible to adjust the resistance value of the variable resistance circuit 73 by switching between ON and OFF of the switch SW1. For example, based on a detection result of the temperature of the amplifier transistor 20 or the like, the resistance value of the variable resistance circuit 73 can be adjusted dynamically during operation of the amplifier circuit 1. Thus, it becomes possible to supply a bias current having an appropriate magnitude to the amplifier transistor 20.

Further, for example, the variable resistance circuit 74 includes the transistor TR1, and the resistance value of the transistor TR1 changes when the voltage applied to the control terminal P1 of the transistor TR1 changes.

This makes it possible to use a MOSFET having a small size and a large ON resistance as a resistor of the variable resistance circuit 74, and thus it becomes possible to achieve the downsizing of the variable resistance circuit 74.

5. Modified Examples

Next, a modified example of the embodiment 1 is described.

Figure 6:
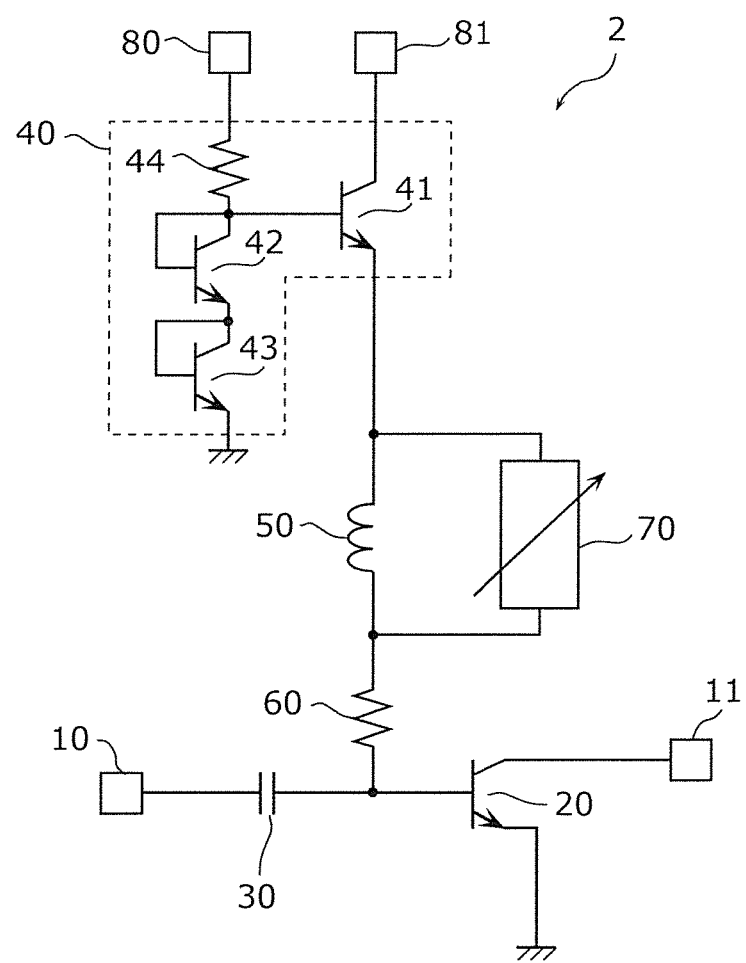
FIG. 6 is a circuit diagram of an amplifier circuit according to a modified example of the embodiment 1.

FIG. 6 is a circuit diagram of an amplifier circuit 2 according to a modified example of the embodiment 1. As illustrated in FIG. 6, the amplifier circuit 2 is different from the amplifier circuit 1 according to the embodiment 1 in the connecting position of the variable resistance circuit 70. Hereinafter, the modified example is described with the emphasis on the difference from the embodiment 1, and the description regarding the common part is omitted or simplified.

In the present modified example, the variable resistance circuit 70 is an example of a second variable resistance circuit connected in parallel to the inductor 50. In this case, also, by changing the resistance value of the variable resistance circuit 70, it becomes possible to change the impedance between the line connecting the input terminal 10 and the base of the amplifier transistor 20 and the emitter of the transistor 41 of the bias circuit 40. Changing the impedance makes it possible to adjust the amount of coupling between a radio frequency signal and the bias circuit 40. Note that as a specific example of the variable resistance circuit 70, the variable resistance circuit 71, 72, 73, or 74 illustrated in FIG. 2 to FIG. 5 can be used.

As described above, in the amplifier circuit 2 according to the present embodiment, the variable resistance circuit 70, 71, 72, 73, or 74 is connected in parallel to the inductor 50.

Because of this, as is the case with the amplifier circuit 1, it becomes possible to facilitate the maintaining of a constant gain when the output power changes. This enables the realization of the amplifier circuit 2 having a more appropriate linearity than the related art.

Embodiment 2

Next, an embodiment 2 will be described. Hereinafter, the embodiment 2 is described with the emphasis on the difference from the embodiment 1, and the description regarding the common part is omitted or simplified.

Figure 7:
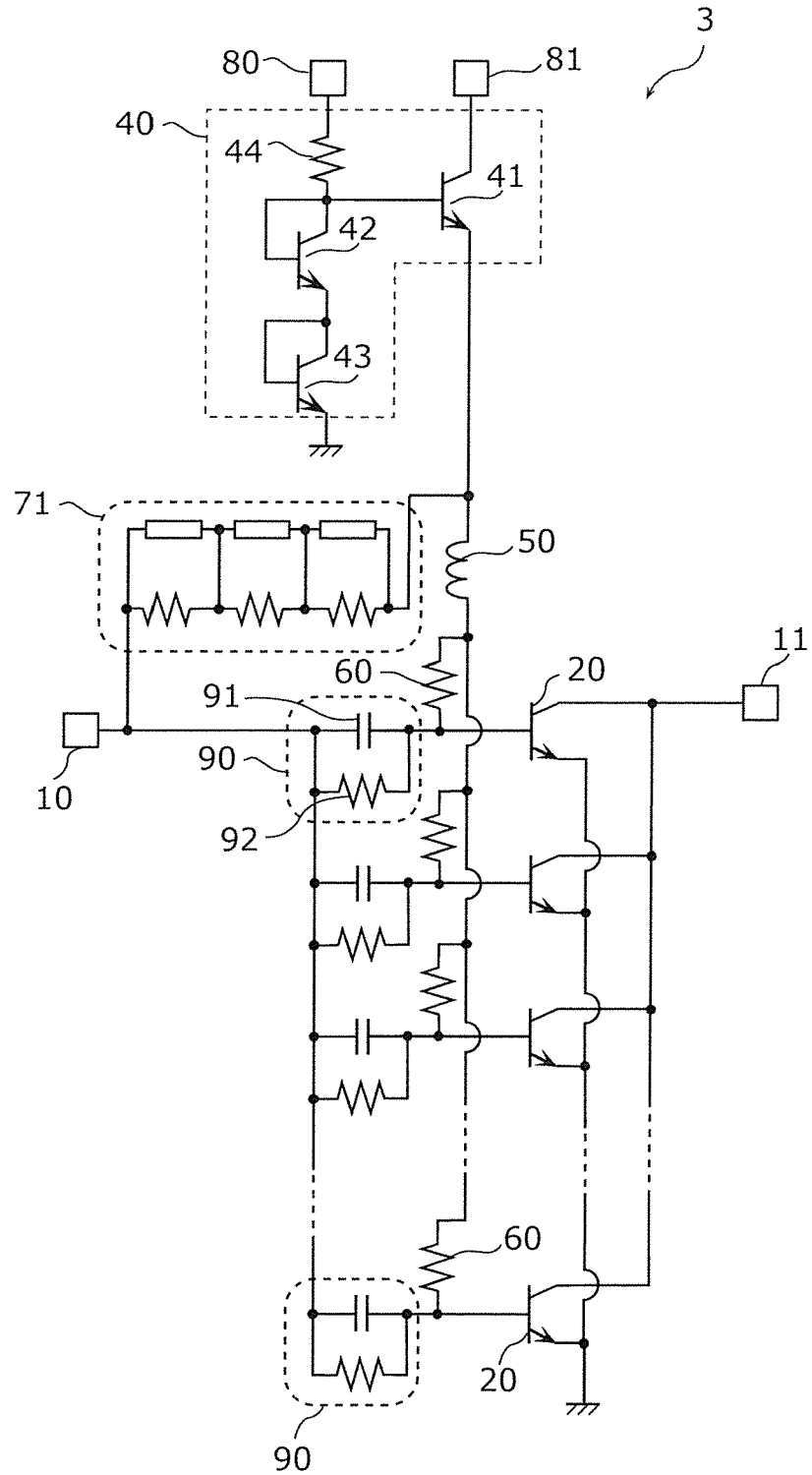
FIG. 7 is a circuit diagram of an amplifier circuit according to an embodiment 2.

FIG. 7 is a circuit diagram of an amplifier circuit 3 according to the present embodiment. As illustrated in FIG. 7, the amplifier circuit 3 is different from the amplifier circuit 1 according to the embodiment 1 in the connecting position of the variable resistance circuit 71, which is an example of the variable resistance circuit 70. Further, in place of the DC-cut capacitor 30, the amplifier circuit 3 includes stabilizer circuits 90. Further, the amplifier circuit 3 includes a plurality of amplifier transistors 20, a plurality of ballast resistors 60, and the plurality of stabilizer circuits 90. Specifically, for each amplifier transistor 20, the ballast resistor 60 and the stabilizer circuit 90 are provided.

The plurality of amplifier transistors 20 are each a multicell type bipolar transistor. Specifically, the collectors of respective ones of the plurality of amplifier transistors 20 are connected to each other and to the output terminal 11. The emitters of respective ones of the plurality of amplifier transistors 20 are connected to each other and to ground. The bases of respective ones of the plurality of amplifier transistors 20 are each connected to the input terminal 10 with the stabilizer circuit 90 interposed therebetween. Specifically, the terminals of respective ones of the stabilizer circuits 90, on the sides not connected to the bases, are connected to each other and to the input terminal 10. Further, the bases of the respective ones of the plurality of amplifier transistors 20 are each connected to the inductor 50 with the ballast resistor 60 interposed therebetween. In the present embodiment, the ballast resistor 60 is connected to the path connecting the stabilizer circuit 90 and the base of the amplifier transistor 20. Specifically, the terminals of respective ones of the plurality of ballast resistors 60, on the sides not connected to the bases, are connected to each other and to the inductor 50.

As illustrated in FIG. 7, the stabilizer circuit 90 includes a capacitor 91 and a resistor 92. The capacitor 91 and the resistor 92 are connected in parallel. That is to say, the stabilizer circuit 90 is a RC parallel circuit that forms a high pass filter. The stabilizer circuit 90 is arranged in series between the input terminal 10 and the base of the amplifier transistor 20. Providing the stabilizer circuit 90 makes it possible to increase stability (K factor) against oscillations in a low frequency region.

The variable resistance circuit 71 according to the present embodiment is an example of a third variable resistance circuit that is connected to the path connecting the input terminal 10 and the base of the amplifier transistor 20 and to the terminal of the inductor 50 on the side toward the emitter of the transistor 41 of the bias circuit 40. Specifically, the variable resistance circuit 71 connects the path connecting the input terminal 10 and the stabilizer circuit 90 and the path connecting the emitter of the transistor 41 of the bias circuit 40 and the inductor 50. The variable resistance circuit 71 functions as a bypass path from the input terminal 10 to the emitter of the transistor 41 of the bias circuit 40. That is to say, part of a radio frequency signal input to the input terminal 10 flows though the bias circuit 40 via the variable resistance circuit 71 and couples with the bias circuit 40. Therefore, as is the case with the embodiment 1, it becomes possible to adjust the amount of coupling between a radio frequency signal and the bias circuit 40 by adjusting the resistance value of the variable resistance circuit 71. This makes it possible to supply a bias current having an appropriate magnitude to the amplifier transistor 20 and to facilitate the maintaining of a constant gain of the amplifier transistor 20 when the output power changes. The variable resistance circuit 71 functions as a distortion-reducing resistor that reduces the distortion of a radio frequency signal on the side of the output terminal 11.

As described above, in the amplifier circuit 3 according to the present embodiment, the variable resistance circuit 71 is connected to the path connecting the input terminal 10 and the control terminal of the amplifier transistor 20 and to the terminal of the inductor 50 on the side toward the emitter of the transistor 41 of the bias circuit 40.

This makes it possible to facilitate the maintaining of a constant gain when the output power changes. This enables the realization of the amplifier circuit 3 having a more appropriate linearity than the related art.

Note that in FIG. 7, the example is described using the case where the variable resistance circuit 71 is connected to the path connecting the input terminal 10 and the bias circuit 40. Alternatively, in place of the variable resistance circuit 71, the variable resistance circuit 72, 73, or 74 illustrated in FIG. 3 to FIG. 5 may be connected.

Embodiment 3

Next, an embodiment 3 will be described. Hereinafter, the embodiment 3 is described with the emphasis on the difference from the embodiment 2, and the description regarding the common part is omitted or simplified.

Figure 8:
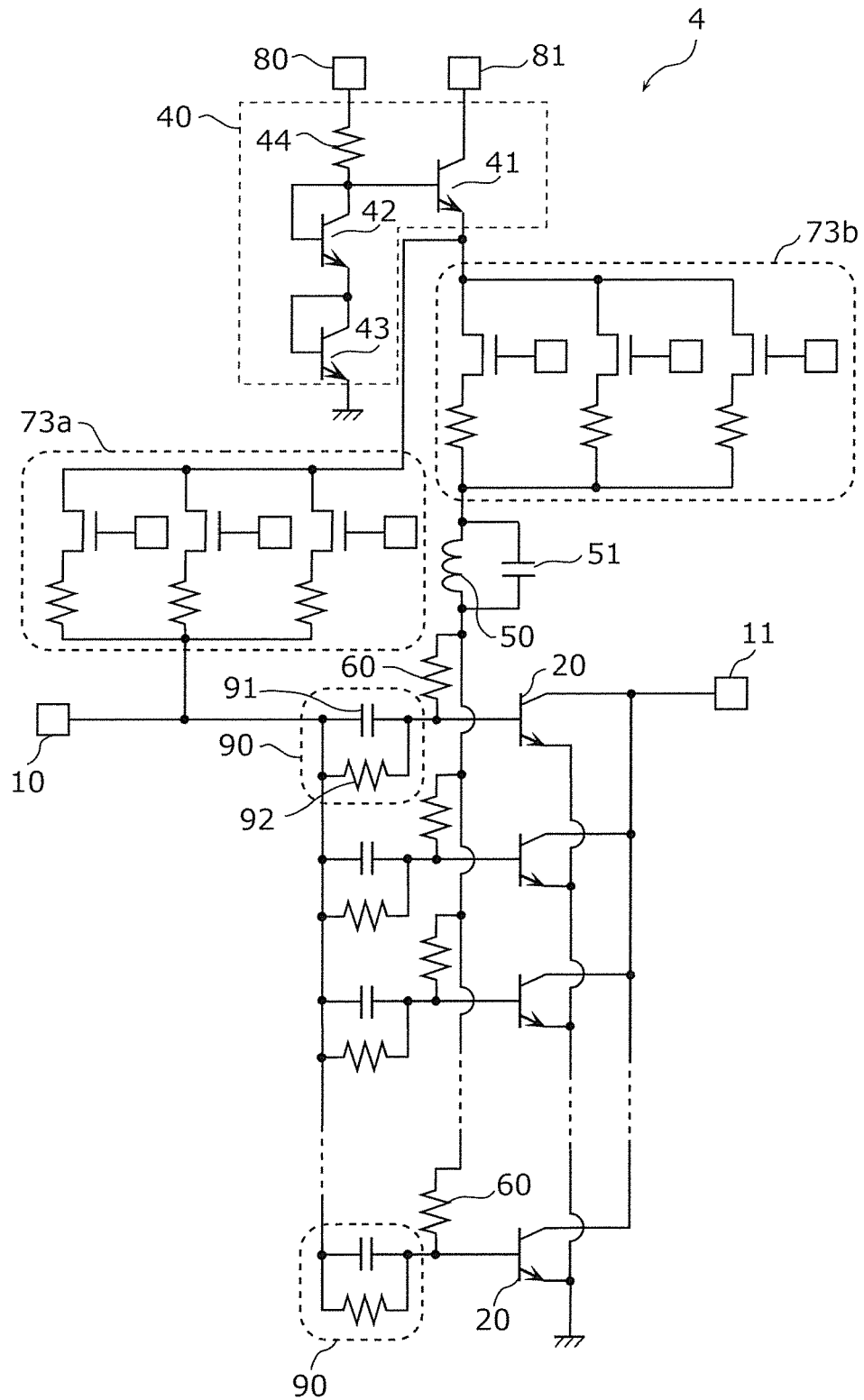
FIG. 8 is a circuit diagram of an amplifier circuit according to an embodiment 3.

FIG. 8 is a circuit diagram of an amplifier circuit 4 according to the present embodiment. As illustrated in FIG. 8, the amplifier circuit 4 is different from the amplifier circuit 3 according to the embodiment 2 in that a plurality of variable resistance circuits are included. Specifically, the amplifier circuit 4 includes two variable resistance circuits 73a and 73b. Further, the amplifier circuit 4 includes a capacitor 51 connected in parallel to the inductor 50.

Because the capacitor 51 is connected in parallel to the inductor 50, it becomes possible to easily increase the impedance between the bias circuit 40 and the base of the amplifier transistor 20. Specifically, even if the inductance value of the inductor 50 is made smaller, it becomes possible to increase the impedance by providing the capacitor 51 having a smaller capacitance value. This makes it possible to downsize the inductor 50.

The variable resistance circuits 73a and 73b both have the same circuit configuration as the variable resistance circuit 73 illustrated in FIG. 4. Alternatively, the circuit configurations of these two variable resistance circuits 73a and 73b may be different from each other. For example, at least one of the two variable resistance circuits 73a and 73b may be the variable resistance circuit 71 illustrated in FIG. 2, the variable resistance circuit 72 illustrated in FIG. 3, or the variable resistance circuit 74 illustrated in FIG. 5.

As illustrated in FIG. 8, as is the case with the variable resistance circuit 71 illustrated in FIG. 7, the variable resistance circuit 73a is an example of the third variable resistance circuit and is connected to the path connecting the input terminal 10 and the base of the amplifier transistor 20 and to the terminal of the inductor 50 on the side toward the emitter of the transistor 41 of the bias circuit 40. As is the case with the variable resistance circuit 70 illustrated in FIG. 1, the variable resistance circuit 73b is an example of the first variable resistance circuit and is connected in series to the inductor 50.

In place of one of the two variable resistance circuits 73a and 73b, the amplifier circuit 4 may include the second variable resistance circuit connected in parallel to the inductor 50. Alternatively, in addition to the two variable resistance circuits 73a and 73b, the amplifier circuit 4 may include the second variable resistance circuit connected in parallel to the inductor 50. That is to say, the amplifier circuit 4 may include three or more variable resistance circuits connected to the inductor 50.

As described above, the amplifier circuit 4 according to the present embodiment includes a plurality of variable resistance circuits. The plurality of variable resistance circuits include at least two of the first variable resistance circuit connected in series to the inductor 50, the second variable resistance circuit connected in parallel to the inductor 50, and the third variable resistance circuit connected to the path connecting the input terminal 10 and the control terminal of the amplifier transistor 20 and to the terminal of the inductor 50 on the side toward the emitter of the transistor 41 of the bias circuit 40.

This makes it possible to widen the range of the adjustment of the amount of coupling of a radio frequency signal or increase the accuracy thereof. Therefore, it becomes possible to realize the amplifier circuit 4 having a further more appropriate linearity than the related art.

Embodiment 4

Next, an embodiment 4 will be described. Hereinafter, the embodiment 4 is described with the emphasis on the difference from the embodiment 3, and the description regarding the common part is omitted or simplified.

Figure 9:
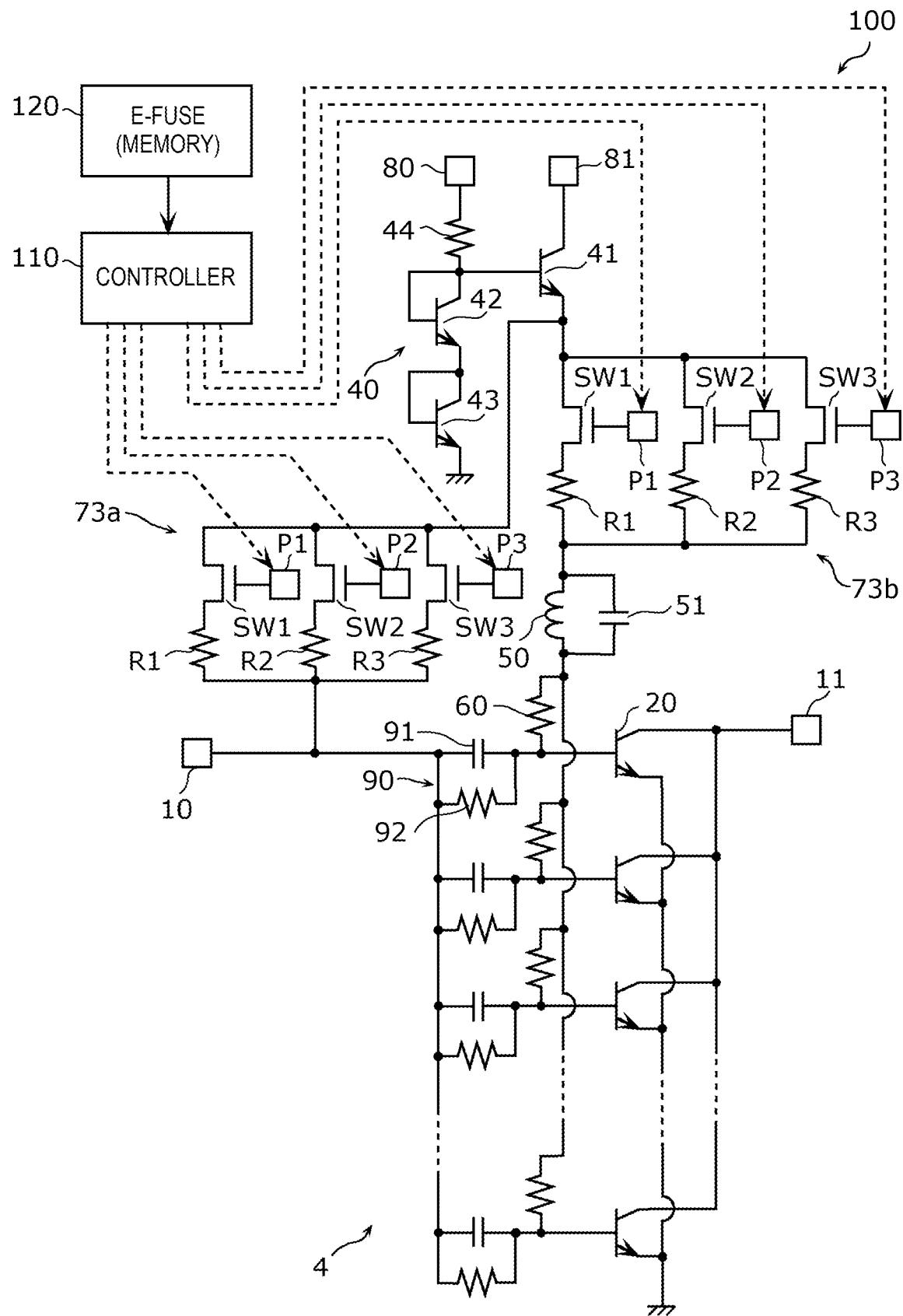
FIG. 9 is a diagram illustrating a configuration of an amplifier device according to an embodiment 4.

FIG. 9 is a diagram illustrating a configuration of an amplifier device 100 according to the present embodiment. As illustrated in FIG. 9, the amplifier device 100 includes the amplifier circuit 4, a controller 110, and an E-fuse 120. Alternatively, in place of the amplifier circuit 4, the amplifier device 100 may include the amplifier circuit 1, 2, or The controller 110 is, for example, realized using an LSI (Large Scale Integration) which is an integrated circuit (IC). Note that the integrated circuit is not limited to the LSI and may alternatively be realized using a dedicated circuit or a general-purpose processor. For example, the controller 110 may be realized using a microcomputer. Further, as the controller 110, a programmable FPGA (Field Programmable Gate Array) or a reconfigurable processor, in which connection or setting of circuit cells in the LSI are reconfigurable, may be used.

The controller 110 controls the variable resistance circuits 73a and 73b included in the amplifier circuit 4. Specifically, the controller 110 controls the switching of the switches SW1 to SW3 between being conductive and non-conductive by outputting control signals to the control terminals P1 to P3 included in each of the variable resistance circuits 73a and 73b.

The E-fuse 120 is an example of a memory and stores therein information indicating whether each of the switches SW1 to SW3 included in the variable resistance circuits 73a and 73b is to be conductive or not. Alternatively, in place of the E-fuse 120, the amplifier device 100 may include another storage device such as a flash memory or the like.

Whether each switch is to be conductive or non-conductive is determined in such a way that each of the resistance values of the variable resistance circuits 73a and 73b becomes an appropriate value for a mass-production variation in characteristics of the amplifier transistor 20 of the amplifier circuit 4. Information indicating a determined result regarding whether the switch is to be conductive or non-conductive is written in the E-fuse 120.

In the present embodiment, the controller 110 controls, based on the information written in the E-fuse 120, the variable resistance circuits 73a and 73b. Specifically, the controller 110 identifies, based on the information written in the E-fuse 120, the switch that needs to be conductive, causes only the identified switch to be conductive, and causes the other switches to be non-conductive.

As described above, the amplifier device 100 according to the present embodiment includes the amplifier circuit 1, 2, 3, or 4 and the controller 110 that controls the variable resistance circuit 73a or 73b.

This makes it possible to easily change at least one of the resistance values of the variable resistance circuits 73a and 73b of the amplifier circuit 4. By adjusting at least one of the resistance values of the variable resistance circuits 73a and 73b, it becomes possible to adjust the amount of coupling between a radio frequency signal and the bias circuit 40. By adjusting the amount of coupling to an appropriate value, a bias current having an appropriate magnitude is supplied to the base of the amplifier transistor 20. Therefore, it becomes possible to facilitate the maintaining of a constant gain when the output power changes. This enables the realization of the amplifier device 100 having a more appropriate linearity than the related art.

Further, for example, the amplifier device 100 further includes the E-fuse 120, which is an example of a memory. The controller 110 controls, based on the information written in the memory, the variable resistance circuits 73a and 73b.

Because of this, by writing the setting of being conductive and non-conductive for the switches included in at least one of the variable resistance circuits 73a and 73b in advance, it becomes possible to easily change at least one of the resistance values of the variable resistance circuits 73a and 73b.

Embodiment 5

Next, an embodiment 5 will be described. Hereinafter, the embodiment 5 is described with the emphasis on the difference from the embodiment 4, and the description regarding the common part is omitted or simplified.

Figure 10:
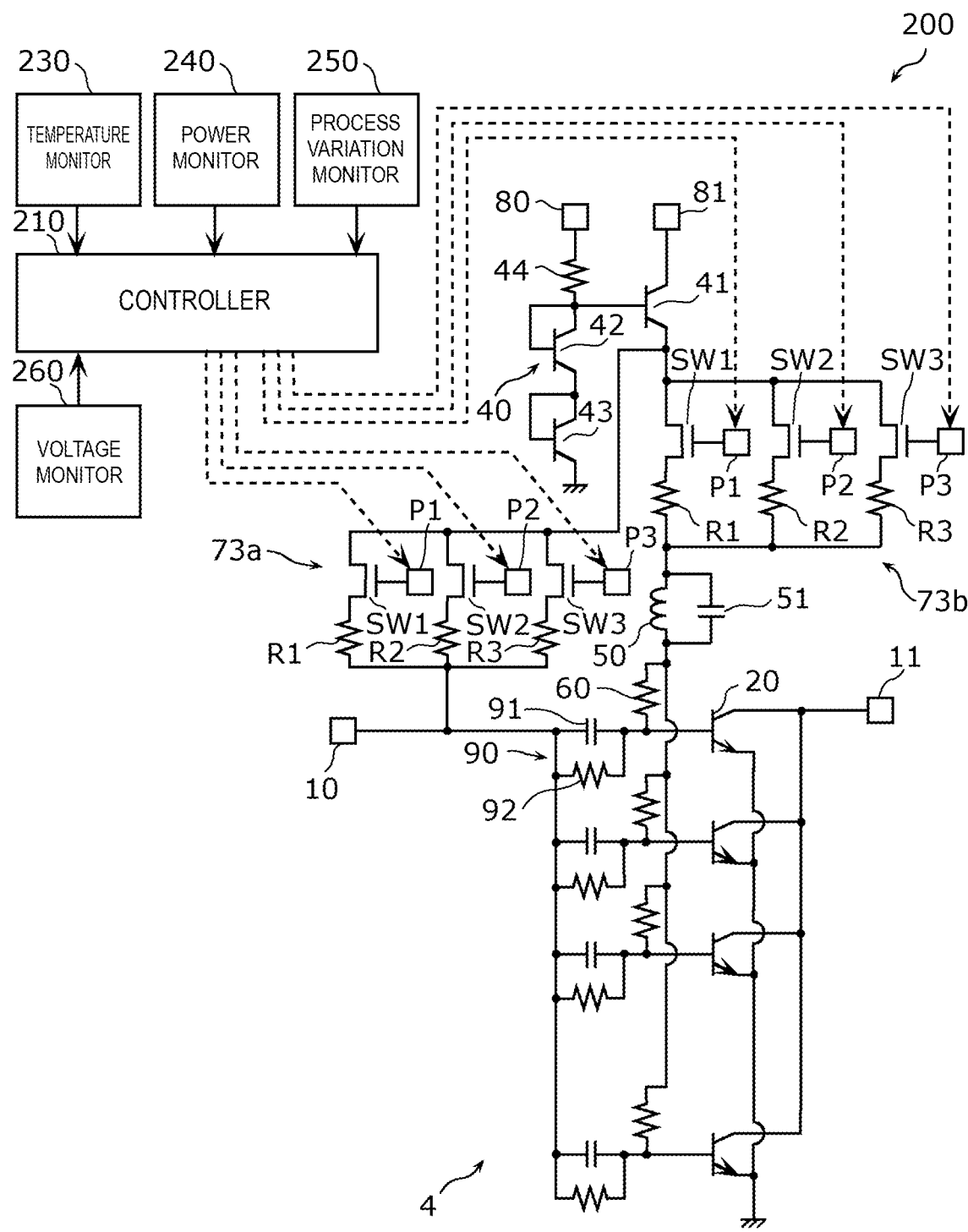
FIG. 10 is a diagram illustrating a configuration of an amplifier device according to an embodiment 5.

FIG. 10 is a diagram illustrating a configuration of an amplifier device 200 according to the present embodiment. As illustrated in FIG. 10, compared with the amplifier device 100 illustrated in FIG. 9, in place of the controller 110 and the E-fuse 120, the amplifier device 200 includes a controller 210, a temperature monitor 230, a power monitor 240, a process variation monitor 250, and a voltage monitor 260. Alternatively, the amplifier device 200 may need to include at least one of the temperature monitor 230, the power monitor 240, the process variation monitor 250, and the voltage monitor 260.

As is the case with the controller 110, the controller 210 controls the variable resistance circuits 73a and 73b included in the amplifier circuit 4. Specifically, the controller 210 controls the variable resistance circuits 73a and 73b, based on a monitoring result of at least one of the temperature monitor 230, the power monitor 240, the process variation monitor 250, and the voltage monitor 260. More specifically, the controller 210 determines, based on the monitoring result, an appropriate resistance value for each of the variable resistance circuits 73a and 73b. The controller 210 controls the switching of the switch between being conductive and non-conductive in such a way that the resistance value of each of the variable resistance circuits 73a and 73b becomes equal to a determined resistance value.

The temperature monitor 230 monitors the temperature of the amplifier circuit 4. The temperature monitor 230 is, for example, a temperature sensor formed on a silicon substrate of an IC element in which the amplifier transistor 20 is formed. The temperature monitor 230 measures the temperature of the amplifier circuit 4 and transmits temperature information indicating the measured temperature to the controller 210 at regular intervals. The controller 210 adjusts the amount of coupling between a radio frequency signal and the bias circuit 40 in response to a change in the temperature of the amplifier circuit 4.

The power monitor 240 similarly monitors the output power of the amplifier circuit 4. The power monitor 240 is, for example, a power meter connected to the output terminal 11. The power monitor 240 measures the output power of the amplifier circuit 4 and transmits power information indicating the measured power value to the controller 210 at regular intervals.

Similarly, the process variation monitor 250 monitors the mass-production variation of the amplifier circuit 4. The process variation monitor 250 is, for example, a detector device that measures a parameter such as a power amplification factor of the amplifier transistor 20 or the like, in which a variation occurs during a fabrication process. The process variation monitor 250 measures, for example, the power amplification factor of the amplifier transistor 20 and transmits variation information indicating the measured power amplification factor to the controller 210.

The voltage monitor 260 similarly monitors the power supply voltage of the amplifier circuit 4. The voltage monitor 260 is, for example, a voltage meter connected to the power supply terminal 81. The voltage monitor 260 measures the power supply voltage of the amplifier circuit 4 and transmits voltage information indicating the measured voltage value to the controller 210 at regular intervals.

As described above, the amplifier device 200 according to the present embodiment further includes, for example, a monitor that monitors a characteristic value of the amplifier circuit 1, 2, 3, or 4. The controller 210 controls, based on a monitoring result obtained by the monitor, the variable resistance circuit 73a or 73b.

This makes it possible to change at least one of the resistance values of the variable resistance circuits 73a and 73b dynamically in response to not only the process variation but also a change in the temperature, the output power, or the power supply voltage. Therefore, it becomes possible to dynamically adjust the amount of coupling between a radio frequency signal and the bias circuit 40, and this makes it possible to supply, to the base of the amplifier transistor 20, a bias current having an appropriate magnitude suitable for usage environments of the amplifier circuit 4. Therefore, this enables the realization of the amplifier device 200 having a more appropriate linearity than the related art.

(Others)

The amplifier circuits and the amplifier devices according to the present disclosure have been described above based on the foregoing embodiments. However, the present disclosure is not limited to the foregoing embodiments.

For example, the amplifier transistor 20, the transistor 41, the transistor 42, or the transistor 43 may be a bipolar transistor formed using gallium arsenide (GaAs). Further, the amplifier transistor 20 may be a pnp-type bipolar transistor. In the case where the amplifier transistor 20 is a pnp-type bipolar transistor, the above-described connecting relationship between the emitter and the collector may be reversed.

Further, for example, the amplifier transistor 20, the transistor 41, the transistor 42, or the transistor 43 may not need to be a bipolar transistor and may be, for example, a transconductance-type element. Specifically, the amplifier transistor 20, the transistor 41, the transistor 42, or the transistor 43 may be a FET, such as a MOSFET, JFET, or the like. The gate, the drain, and the source of a FET correspond to the base, which is an example of the control terminal, the collector, and the emitter, respectively.

Further, for example, each of the transistor 41, the transistor 42, and the transistor 43 may be a FET. That is to say, the bias circuit 40 may include a source-follower circuit. In that case, the inductor 50 is arranged in series between the source of the source-follower circuit and the control terminal of the amplifier transistor 20.

Further, for example, a specific example of the variable resistance circuit 70 is not limited to the examples illustrated as the variable resistance circuit 71, 72, 73, or 74. For example, the variable resistance circuit 70 may include two or more resistors connected in series and two or more resistors connected in parallel. Further, a switch may be connected in series or in parallel to each resistor. The variable resistance circuit 70 may include both the trimming pattern and the switch. As the switch included in the variable resistance circuit 70, a transmission gate may be used.

Figure 11:
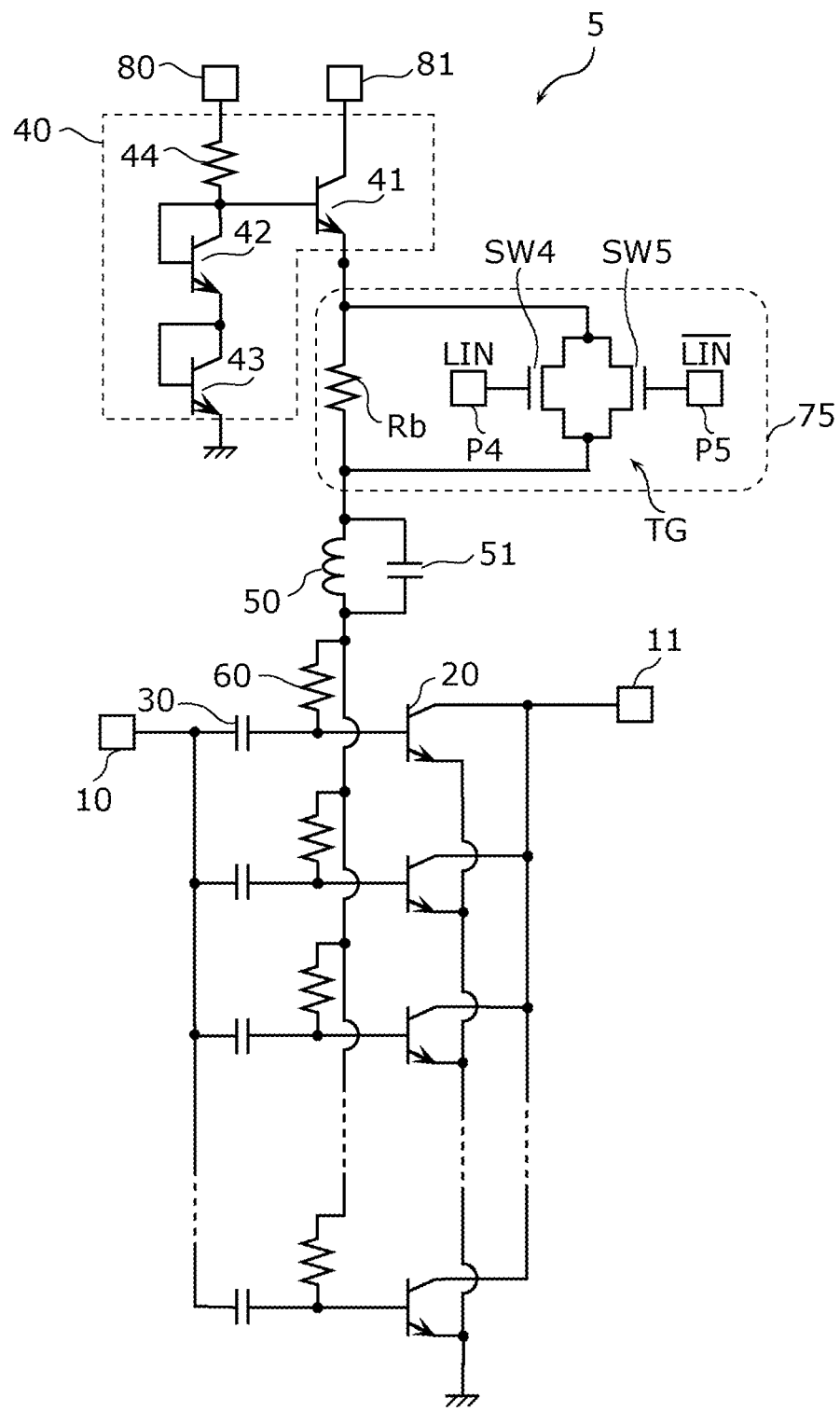
FIG. 11 is a circuit diagram of an amplifier circuit according to a modified example of an embodiment.

FIG. 11 is a circuit diagram of an amplifier circuit 5 according to a modified example of the embodiment. As illustrated in FIG. 11, the amplifier circuit 5 is different from the amplifier circuit 4 according to the embodiment 3 in that a variable resistance circuit 75 is included in place of the variable resistance circuits 73a and 73b and in that the DC-cut capacitor 30 is included in place of the stabilizer circuit 90. Alternatively, in place of the DC-cut capacitor 30, the amplifier circuit 5 may include the stabilizer circuit 90. Further, the amplifier circuit 5 may include the variable resistance circuit 73a. Hereinafter, the description is provided with the emphasis on the difference from the embodiment 3, and the description regarding the common part is omitted or simplified.

The variable resistance circuit 75 is an example of the first variable resistance circuit connected in series to the inductor 50. As illustrated in FIG. 11, the variable resistance circuit 75 includes a resistor Rb and a transmission gate TG. The resistor Rb is connected in series between the emitter of the transistor 41 that forms the emitter-follower circuit of the bias circuit 40 and the inductor 50. The resistor Rb is a fixed resistor whose resistance value does not change.

The transmission gate TG is connected in parallel to the resistor Rb. The transmission gate TG includes two switches SW4 and SW5 and two control terminals P4 and P5. These two switches SW4 and SW5 are switches whose polarities are different from each other. Specifically, the switch SW4 is a nMOSFET, and the switch SW5 is a pMOSFET. The switches SW4 and SW5 switch between being conductive and non-conductive in response to control signals supplied to the control terminals P4 and P5, respectively. The control terminal P4 is connected to the gate of the switch SW4. The control terminal P5 is connected to the gate of the switch SW5. The control terminals P4 and P5 receive signals that have opposite polarities.

For example, when a high level signal is input to the control terminal P4, a low level signal is input to the control terminal P5. In this case, both the switches SW4 and SW5 become conductive. That is to say, the transmission gate TG is turned on (becomes conductive), and the resistance value of the variable resistance circuit 75 becomes smaller.

When a low level signal is input to the control terminal P4, a high level signal is input to the control terminal P5. In this case, both the switches SW4 and SW5 become non-conductive. That is to say, the transmission gate TG is turned off (becomes non-conductive), and the resistance value of the variable resistance circuit 75 becomes larger.

As described above, it becomes possible to make the resistance value of the variable resistance circuit 75 variable by turning on/off the transmission gate TG. Therefore, it becomes possible to adjust the amount of coupling between a radio frequency signal and the bias circuit 40 by adjusting the resistance value of the variable resistance circuit 75. As is the case with each of the embodiments described above, this enables the realization of the amplifier circuit 5 having a more appropriate linearity than the related art.

The variable resistance circuit 75 may be arranged in series between the input terminal 10 and the emitter of the transistor 41. Further, the variable resistance circuit 75 may be connected in parallel to the inductor 50.

Note that in the embodiment 5 described above, the example is described using the case where the resistance values of the variable resistance circuits 73a and 73b are changed according to a change in the process variation, the temperature, the output power, the power supply voltage, or the like. However, the present embodiment is not limited thereto. In the following, an example is described using a case where the resistance value of the variable resistance circuit is changed according to the amplification factor (output mode) of the amplifier circuit.

For example, in the amplifier circuit 1 illustrated in FIG. 1, in some cases, the output mode is switched as a function of the intensity of a signal input to the input terminal 10. Specifically, in the case where the intensity of a signal input to the input terminal 10 is relatively low, a high output mode is used by increasing the amplification factor of the amplifier transistor 20. Further, in the case where the intensity of a signal input to the input terminal 10 is relatively high, a low output mode is used by decreasing the amplification factor of the amplifier transistor 20. At the time of the high output mode, for example, the bias current of the amplifier transistor 20 is increased by increasing the base voltage of the transistor 41. Whereas, at the time of the low output mode, for example, the bias current of the amplifier transistor 20 is decreased by decreasing the base voltage of the transistor 41.

Figure 12:
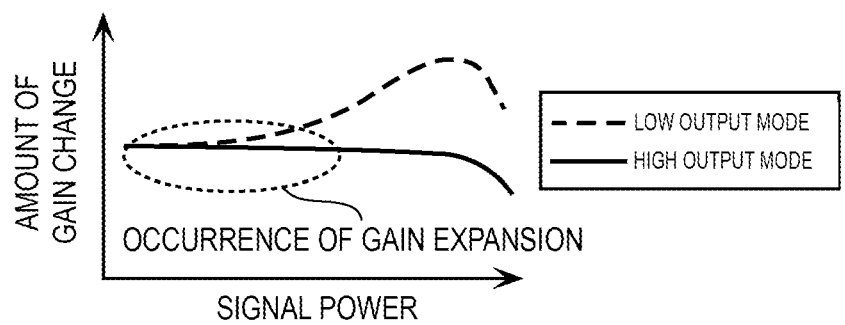
FIG. 12 is a diagram for illustrating a problem at the time of low output mode in a comparative example.

At this time, particularly at the time of the low output mode, as illustrated in FIG. 12, when the bias current of the amplifier transistor 20 decreases, there is a problem of degradation in a distortion characteristic such as EVM or the like due to the occurrence of gain expansion. Note that FIG. 12 is a diagram for illustrating the problem of the low output mode in a comparative example. In FIG. 12, the horizontal axis represents the signal power, the vertical axis represents the amount of gain change. The amount of gain change is the amount of change in the gain using, as a reference, a gain G0 of the amplifier transistor 20 when the signal power is small. For example, the vertical axis is G(x)-G0 where G(x) is the gain when the signal power is x[dBm].

Accordingly, in the amplifier circuits according to the embodiments and the modified examples described above, the resistance value of the variable resistance circuit 70 may be changed in response to a change in the output mode. Specifically, at the time of the high output mode, the resistance value of the variable resistance circuit 70 is decreased, and at the time of the low output mode, the resistance value of the variable resistance circuit 70 is increased.

Figure 13:
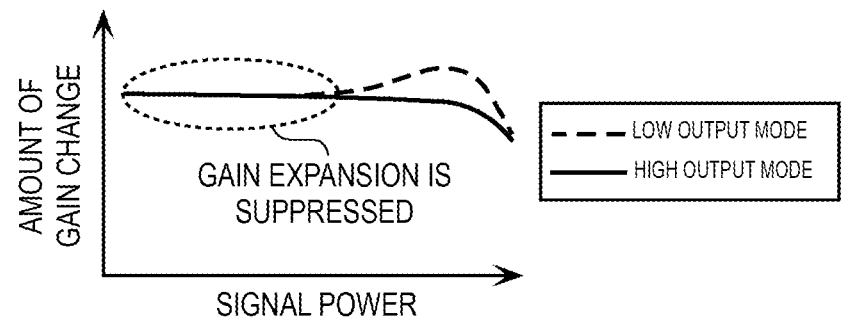
FIG. 13 is a diagram for illustrating an effect at the time of low output mode produced by the amplifier circuits according to the embodiments and the modified examples thereof.

FIG. 13 is a diagram for illustrating an effect at the time of the low output mode produced by the amplifier circuits according to the embodiments and the modified examples thereof. The horizontal axis and the vertical axis of FIG. 13 are the same as those in FIG. 12. As illustrated in FIG. 13, in the amplifier circuit 1, an increase in current at the time of high output is suppressed when the resistance value of the variable resistance circuit 70 is increased. Because of this, it is found that the gain expansion particularly at the time of the low output mode is suppressed and that a stable rise is achieved.

As described above, when the amplifier circuit 1 is operated in the low output mode, the bias current supplied to the amplifier transistor 20 is decreased, and the resistance value of the variable resistance circuit 70 is increased. When the amplifier circuit 1 is operated in the high output mode, the bias current supplied to the amplifier transistor 20 is increased, and the resistance value of the variable resistance circuit 70 is decreased. This makes it possible to improve the distortion characteristic of the amplifier circuit 1.

Note that switching of the resistance value in the high output mode and the low output mode is achieved, for example, by using the variable resistance circuit 75 illustrated in FIG. 11, and this enables the downsizing of the amplifier circuit. Specifically, a signal input to the control terminal P4 is set to a high level at the time of the high output mode and to a low level at the time of the low output mode. Because of this, in the high output mode, it becomes possible to make the resistance value of the variable resistance circuit 75 smaller by turning the transmission gate TG on. In the low output mode, it becomes possible to make the resistance value of the variable resistance circuit 75 larger by turning the transmission gate TG off. Similarly, the resistance value of the variable resistance circuit 72, 73, or 74 may be adjusted according to the output mode.

In addition, embodiments obtained by applying various modifications apparent to those skilled in the art to the embodiments and embodiments formed by arbitrary combining constituent elements and functions of different embodiments in such a way that they do not depart from the scope of the present disclosure are also included in the present disclosure.

INDUSTRIAL APPLICABILITY

The present disclosure can be widely used in communication devices such as mobile phones and the like as an amplifier circuit of a radio frequency module installed in a multiband front-end unit.

REFERENCE SIGNS LIST 1, 2, 3, 4, 5 Amplifier circuit
10 Input terminal
11 Output terminal
20 Amplifier transistor
30 DC-cut capacitor
40 Bias circuit
41, 42, 43 Transistor
44, 92 Resistor
50 Inductor
51, 91 Capacitor
60 Ballast resistor
70, 71, 72, 73, 73a, 73b, 74, 75 Variable resistance circuit
70a, 70b Terminal
80, 81 Power supply terminal
90 Stabilizer circuit
100, 200 Amplifier device
110, 210 Controller
120 E-fuse
230 Temperature monitor
240 Power monitor
250 Process variation monitor
260 Voltage monitor
P1, P2, P3, P4, P5 Control terminal
R1, R2, R3, Rb Resistor
SW1, SW2, SW3, SW4, SW5 Switch
TG Transmission gate
TP1, TP2, TP3 Trimming pattern
TR1 Transistor

The invention claimed is:

1. An amplifier circuit comprising:
an input terminal to which a radio frequency signal is input;
an amplifier transistor that has a control terminal and that is configured to amplify the radio frequency signal;
a bias circuit that comprises an emitter-follower circuit or a source-follower circuit, and that is configured to supply a bias current to the control terminal;
an inductor connected in series between an emitter of the emitter-follower circuit and the control terminal, or between a source of the source-follower circuit and the control terminal; and
a variable resistance circuit connected to the inductor, wherein the variable resistance circuit is connected in parallel with the inductor.

2. The amplifier circuit according to claim 1, wherein the variable resistance circuit is connected between the inductor and the emitter or the source, and is connected via the inductor to a path that connects the input terminal to the control terminal.

3. The amplifier circuit according to claim 1, wherein:
the variable resistance circuit comprises a plurality of variable resistance circuits, and
the plurality of variable resistance circuits comprise at least two of:
a first variable resistance circuit connected in series with the inductor,
a second variable resistance circuit connected in parallel with the inductor, and
a third variable resistance circuit connected between the inductor and the emitter or the source, and connected via the inductor to a path that connects the input terminal to the control terminal.

4. The amplifier circuit according to claim 1, further comprising:
a ballast resistor connected in series between the inductor and the control terminal.

5. The amplifier circuit according to claim 1, wherein the variable resistance circuit comprises:
a resistor; and
a switch connected in parallel with the resistor.

6. The amplifier circuit according to claim 1, wherein the variable resistance circuit comprises:
a resistor; and
a switch connected in series with the resistor.

7. The amplifier circuit according to claim 1, wherein:
the variable resistance circuit comprises a transistor, and
a resistance value of the transistor changes when a voltage applied to a control terminal of the transistor changes.

8. An amplifier device comprising:
an amplifier circuit comprising:
an input terminal to which a radio frequency signal is input,
an amplifier transistor that has a control terminal and that is configured to amplify the radio frequency signal,
a bias circuit that comprises an emitter-follower circuit or a source-follower circuit, and that is configured to supply a bias current to the control terminal,
an inductor connected in series between an emitter of the emitter-follower circuit and the control terminal, or between a source of the source-follower circuit and the control terminal, and a variable resistance circuit connected to the inductor; and a controller configured to control a resistance of the variable resistance circuit.

9. The amplifier device according to claim 8, further comprising:

a memory, wherein the controller is configured to control the resistance of the variable resistance circuit based on information stored in the memory.

10. The amplifier device according to claim 8, further comprising:

a monitor configured to monitor a physical or electrical characteristic of the amplifier circuit, wherein the controller is configured to control the resistance of the variable resistance circuit based on the monitored characteristic.

11. The amplifier device according to claim 10, wherein the monitor is a temperature sensor configured to measure a temperature of the amplifier circuit.

12. The amplifier device according to claim 10, wherein the monitor is a power meter configured to measure an output power of the amplifier circuit.

13. The amplifier device according to claim 10, wherein the monitor is configured to measure a power amplification factor of the amplifier transistor.

14. The amplifier device according to claim 10, wherein the monitor is a voltage meter configured to measure a power supply voltage of the amplifier circuit.

* * * * *